(12) United States Patent
Sasaki

(10) Patent No.: US 8,314,534 B2
(45) Date of Patent: Nov. 20, 2012

(54) CRYSTAL DEVICE

(75) Inventor: Hiroyuki Sasaki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 48 days.

(21) Appl. No.: 12/928,370

(22) Filed: Dec. 10, 2010

(65) Prior Publication Data

US 2011/0148538 A1 Jun. 23, 2011

(30) Foreign Application Priority Data

Dec. 22, 2009 (JP) .................................. 2009-290409
Nov. 11, 2010 (JP) .................................. 2010-252734

(51) Int. Cl.
*H03B 5/30* (2006.01)
(52) U.S. Cl. ........................................ 310/348; 310/370
(58) Field of Classification Search .................. 310/348, 310/370
See application file for complete search history.

(56) References Cited

U.S. PATENT DOCUMENTS

| | | | | |
|---|---|---|---|---|
| 2006/0170305 | A1* | 8/2006 | Ohshima et al. | 310/311 |
| 2007/0176518 | A1* | 8/2007 | Moriya | 310/348 |
| 2008/0289162 | A1* | 11/2008 | Ohshima et al. | 29/25.35 |
| 2009/0256449 | A1* | 10/2009 | Nishimura et al. | 310/348 |

FOREIGN PATENT DOCUMENTS

| | | |
|---|---|---|
| JP | 2001-196886 | 7/2001 |
| JP | 2003-152499 | 5/2003 |
| JP | 2006-295246 | 10/2006 |
| JP | 2007-96529 | 4/2007 |
| JP | 2009-171591 | 7/2009 |

* cited by examiner

*Primary Examiner* — Walter Benson
*Assistant Examiner* — Bryan Gordon
(74) *Attorney, Agent, or Firm* — Edwards Wildman Palmer LLP; Scott D. Wofsy

(57) ABSTRACT

An object is to provide a crystal device in which an influence due to an electroconductive adhesive is reduced, and vibration characteristics of a crystal piece are favorably maintained. A configuration is such that in a crystal device including: a container main body having a concavity, with a crystal retention terminal formed in a bottom face of the concavity, and with a mounting terminal that is electrically connected to the crystal retention terminal formed on an outer bottom face; a crystal piece accommodated in the concavity, with an excitation electrode formed on both main faces, and with a support electrode that is electrically connected to the excitation electrode using a connecting electrode, formed on both sides of one end portion, and with the support electrode bonded to the crystal retention terminal with an electroconductive adhesive; and a cover that is connected to an open end face of the container main body and hermetically seals the crystal piece, there is provided a jetty being a main face of the crystal piece, and that protrudes on a periphery of the support electrode, and the jetty is formed integral with the crystal piece.

14 Claims, 15 Drawing Sheets

(a)

(b)

(a)

(b)

(c)

(a)

(b)

(c)

(a)

(b)

(c)

(a)

(b)

(c)

(a)

(b)

(c)

CRYSTAL DEVICE

BACKGROUND OF THE INVENTION

1. Technical Field

The present invention relates to a crystal device, in particular to a crystal device in which an electroconductive adhesive is used to fix a crystal piece to a container main body.

2. Background Art

A crystal device, for example a crystal oscillator, is known as a frequency controlling element, and is widely built into telecommunication equipment and digital controllers. As one of these, there is a crystal oscillator of a surface-mounted type (hereunder referred to as a surface-mounted oscillator) in which a crystal piece is fixed to a container main body using an electroconductive adhesive, and mass production of this is advancing.

(First Conventional Technique; Refer To Patent Document 1)

FIG. 13 and FIG. 14 are diagrams for explaining a surface-mounted oscillator of a first conventional technique, wherein FIG. 13(a) is a plan view of a crystal piece, FIG. 13(b) is a cross-sectional view on arrows A-A of FIG. 13(a), and FIG. 13(c) is a cross-sectional view on arrows B-B of FIG. 13(a), while FIG. 14 is a longitudinal cross-sectional view of the surface-mounted oscillator.

The surface-mounted oscillator 1 of the first conventional technique (refer to FIG. 14) is configured with a crystal piece 3A accommodated in a container main body 2 having a concavity 2e, and a cover 4 connected to an open end face of the container main body 2. The container main body 2 is made from ceramics, and is formed with a frame wall 2b laminated on a planar bottom wall 2a. On an inner bottom face 2c of the container main body 2 there is provided a crystal retention terminal 5. The crystal retention terminal 5 is electrically connected to a mount terminal 7 formed on an outer bottom face 2d of the container main body 2, via a conduction path 6.

The crystal piece 3A accommodated in the container main body 2 (refer to FIG. 13) is AT cut, and is an approximate rectangular shape in plan view with the longitudinal direction of the crystal piece 3A as the X axis. Furthermore, an excitation electrode 8 is formed on both main surfaces of the crystal piece 3A, and on both sides of one end portion in the longitudinal direction thereof, there is formed a support electrode 10 which is electrically connected to the excitation electrode 8 using a connection electrode 9. Moreover, on one main face of the crystal piece 3A there is formed a jetty 11 made from a silicone gum (heat curing silicone adhesive).

The jetty 11 comprises a first jetty component 12a that is formed between the support electrode 10 and the excitation electrode 8 along the full width in the widthwise direction of the crystal piece 3A, and a second jetty component 12b that extends from the centre of the first jetty component 12a to the periphery of one end portion of the crystal piece 3A on which the support electrode 10 is formed. In such a crystal piece 3A, the support electrode 10 is bonded to the crystal retention terminal 5 with an electroconductive adhesive 13 (refer to FIG. 14), and is thus fixed to the inner bottom face 2c of the container main body 2.

To the open end face of the container main body 2 there is connected a cover 4 for hermetically sealing the crystal piece 3A. The cover 4 is made from Kovar in which Fe (iron) is the main component to which is added Ni (nickel) and Co (cobalt). On the surface of the cover 4 there is formed a nickel film by means of for example electroplating. Furthermore, the cover 4 is connected for example to a metal ring (not shown in the figure) provided on the open end face of the container main body 2, by for example seam welding, so that the crystal piece 3A is hermetically sealed inside the container main body 2.

In such a device, since the jetty 11 made from an elastic material such as silicone gum is provided on one main face of the crystal piece 3A, flow out of the electroconductive adhesive 13 to the outside of the support electrode 10 can be prevented by a simple low cost process (refer to paragraph 0006 of Patent Document 1). By means of this jetty 11, influence on the vibration area formed by the excitation electrode 8, and contact of the electroconductive adhesive 13 between both sides of the one end portion is prevented, so that thickness-shear vibration is ensured giving good vibration characteristics.

(Second Conventional Technique, Refer To Patent Document 2)

FIG. 15 is a diagram for explaining a tuning fork type surface-mounted oscillator of a second conventional technique, wherein FIG. 15(a) is a plan view of a crystal piece, FIG. 15(b) is a cross-sectional view on arrows A-A of FIG. 15(a), and FIG. 15(c) is a cross-sectional view on arrows B-B of FIG. 15(a). Parts the same as in the first conventional technique are denoted by the same reference symbols and description thereof is simplified or omitted.

A crystal piece 3B used in the surface-mounted oscillator of the second conventional technique, as shown in FIG. 15, is formed in a tuning fork shape with a pair of vibrating arms 15 extended from one end portion of a base 14, being a so called tuning fork type oscillator. In the vibrating arms 15 there is formed a microgroove 16 for increasing the electric field strength, and in the microgroove 16 there is formed an excitation electrode 8. On both sides of the other end portion of the base 14 there is formed support electrodes 10 connected electrically to the excitation electrode 8 using a connection electrode (not shown in the figure). Furthermore, a jetty 11 is formed between the pair of support electrodes 10.

In such a device, when the crystal piece 3B is fixed in the concavity of the container main body (not shown in the figure), a situation where the electroconductive adhesive (not shown in the figure) flows out in a direction mutually approaching the pair of support electrodes 10, can be prevented by the jetty 11 (refer to paragraph 0039 in Patent Document 2). As a result, contact of the electroconductive adhesive 13 between both sides of the end portion is prevented, so that tuning fork vibration is ensured.

Prior Art Documents.

Patent Document 1: Japanese Unexamined Patent Publication No. 2007-96529

Patent Document 2: Japanese Unexamined Patent Publication No. 2003-152499

SUMMARY OF THE INVENTION

[Problems That The Invention Is To Solve]

(Problem of First Conventional Technique)

However, in the abovementioned surface-mounted oscillator 1 of the first conventional technique, silicone gum for example is spread on the crystal piece 3A to thereby form the jetty 11. However for example, it is difficult to form the jetty 11 with a dimensional accuracy of the order of a micron. Consequently, due to positional displacement and the like of the jetty made from silicone gum, the area of the crystal piece 3A that contacts with the electroconductive adhesive 13, in particular the area of the support electrode 10 differs for each product. Therefore there is a problem in that the vibration characteristics including the oscillation frequency and the crystal impedance (CI value) are also likely to differ for each product.

Furthermore, since the jetty 11 is made from an elastic material, there is a situation where a portion of the jetty 11 peels off from the crystal piece 3A over a long period of time. Therefore, the contact area between the crystal piece 3A and the jetty 11 changes, so that there is a problem in that the oscillation frequency of the crystal piece 3A and the vibration characteristics such as the CI value change.

Moreover, since the jetty 11 is made for example from silicone gum, then over time, for example siloxane gas is likely to be released from the jetty 11. Then, if the released siloxane gas adheres to the crystal piece 3A, there is a problem in that due to the mass addition effect, the frequency of the crystal piece 3A changes.

(Problem With Second Conventional Technique)

Furthermore, in the abovementioned surface-mounted oscillator 1 of the second conventional technique, there is the likelihood that the electroconductive adhesive 13 adhered to the support electrode 10 will flow out in the excitation electrode 8 direction.

Here it is known that in general, as the electroconductive adhesive 13 approaches the excitation electrode 8, the CI value (crystal impedance) of the crystal piece 3B becomes higher. Consequently, if the electroconductive adhesive 13 flows out from the support electrode 10 to the excitation electrode 8 in the excitation electrode 8 direction, there is a problem in that the CI value becomes higher. This problem becomes particularly significant with miniaturization of the crystal piece, since the excitation electrode 8 and the support electrode 10 become close.

(Object Of The Invention)

An object of the present invention is to provide a crystal device in which the influence due to the electroconductive adhesive is reduced, and vibration characteristics are favourably maintained.

[Means To Solve The Problem]

In the present invention, the configuration is such that in a crystal device comprising: a container main body having a concavity, with a crystal retention terminal formed in a bottom face of the concavity, and with a mounting terminal that is electrically connected to the crystal retention terminal formed on an outer bottom face; a crystal piece accommodated in the concavity, with an excitation electrode formed on both main faces, and with a support electrode that is electrically connected to the excitation electrode using a connecting electrode, formed on both sides of one end portion, and with the support electrode bonded to the crystal retention terminal with an electroconductive adhesive; and a cover that is connected to an open end face of the container main body and hermetically seals the crystal piece, there is provided a wall being a main face of the crystal piece, and that protrudes on a periphery of the support electrode, and the wall is formed integral with the crystal piece.

[Effects of the Invention]

According to this configuration, since the wall is formed on the periphery of the support electrode, the electroconductive adhesive that is adhered to the support electrode does not flow out towards the excitation electrode. Consequently, the likelihood of an increase in the CI value of the crystal piece due to the electroconductive adhesive is reduced. Furthermore, since the wall is formed integrally with the crystal piece, it is unlikely to peel away from the crystal piece. Consequently, there is no longer the situation where the contact area between the crystal piece and the wall changes so that the oscillation frequency of the crystal piece or the CI value and the like change. Hence the vibration characteristics are stable and favourably maintained. Furthermore, since the wall is made from crystal, there is no longer the situation for example as with the conventional example, where siloxane gas is released from the wall over time. Consequently, the likelihood of a change in the frequency of the crystal piece due to the mass addition effect is reduced.

(Embodiments)

In the present invention, the configuration is such that the jetty is formed on the periphery of the support electrode, so that a side face on the support electrode side of the jetty becomes the wall. As a result, even in the case where the thickness of the crystal piece is thin, the wall can be formed while maintaining the strength of the crystal piece.

Furthermore, in the present invention, the configuration is such that the first jetty that surrounds the periphery of the support electrode formed on one side of the one end portion of the crystal piece, and the second jetty that surrounds the periphery of the support electrode formed on the other side, are spaced apart.

Moreover, in the present invention, the configuration is such that a depression is formed in both sides of one end portion of the crystal piece, and the depression is open to an outside face of the crystal piece, and the support electrode is formed in a bottom face of the depression, and a side face of the depression becomes the wall.

Furthermore, in the present invention, the configuration is such that a depression with a closed side face is formed in both sides of one end portion of the crystal piece, and the support electrode is formed in a bottom face of the depression, and a side face of the depression becomes the wall.

In the present invention, the configuration is such that the crystal piece is rectangular in plan view, and a thickness of the crystal piece in a central area of the support electrode formed on both sides of the crystal piece, and in an area in which the excitation electrode is formed is the same. As a result, the crystal piece becomes one which contacts with an infinite plate, and hence its design can be simplified.

BEST MODE FOR CARRYING OUT THE INVENTION (First Embodiment)

Figure 1:
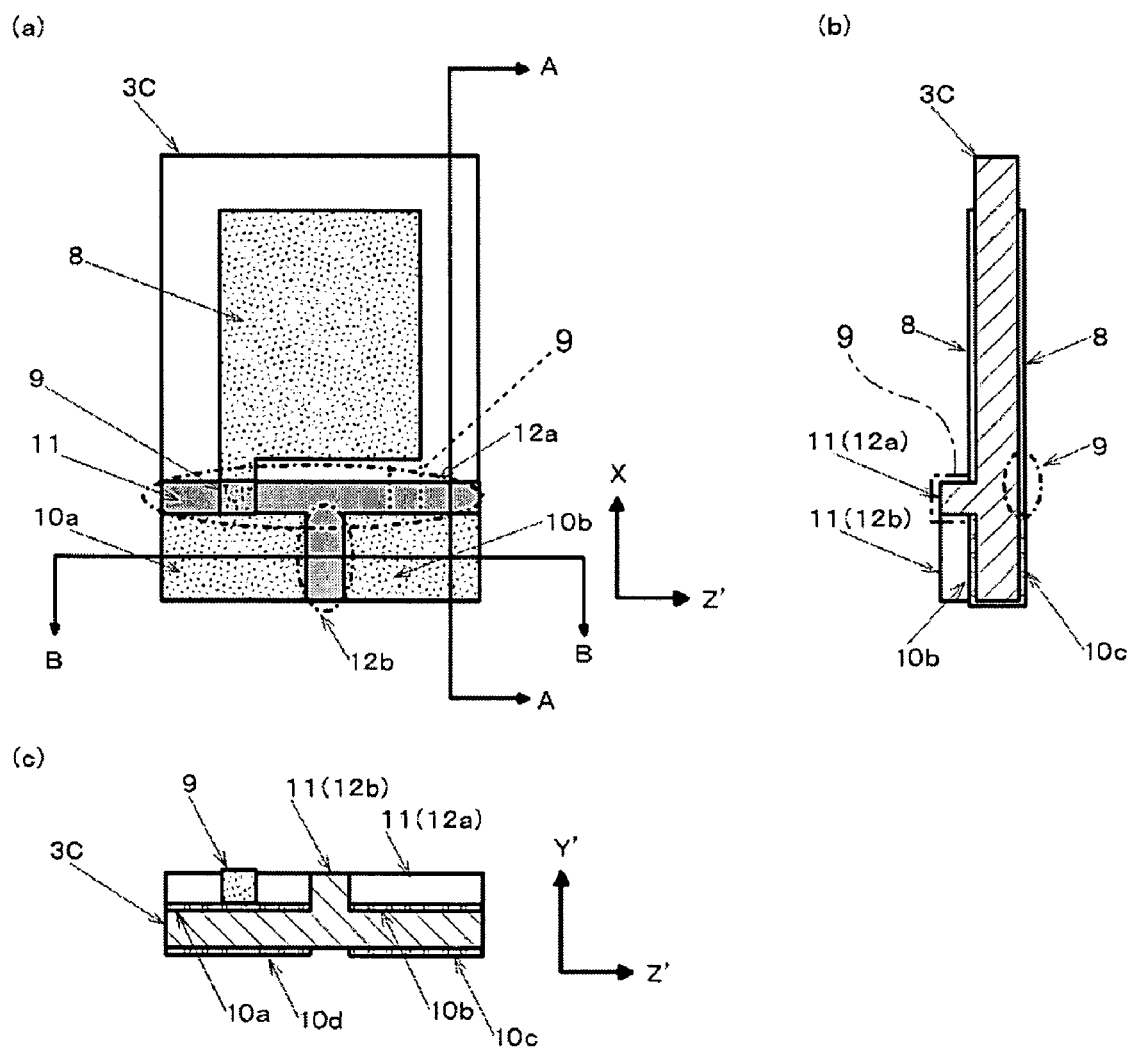
FIG. 1 is a diagram for explaining a first embodiment of the present invention, wherein (a) is a plan view of a crystal piece, (b) is a cross-sectional view on arrows A-A of (a), and (c) is a cross-sectional view on arrows B-B of (a).
Figure 2:
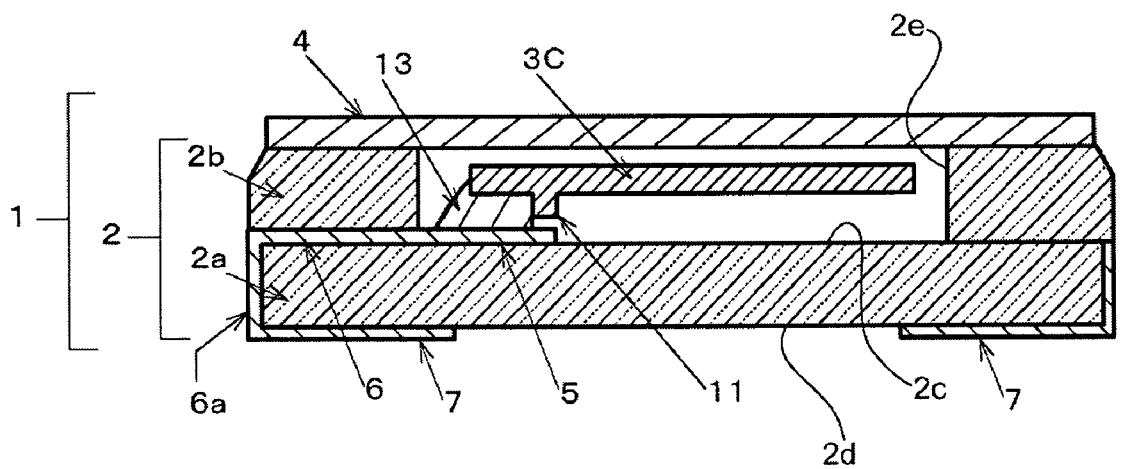
FIG. 2 is a longitudinal cross-sectional view for explaining a first embodiment of a surface-mounted oscillator of the present invention.

FIG. 1 and FIG. 2 are diagrams for explaining a first embodiment of the present invention, wherein FIG. 1(*a*) is a plan view of a crystal piece, FIG. 1(*b*) is a cross-sectional view on arrows A-A of FIG. 1(*a*), and FIG. 1(*c*) is a cross-sectional view on arrows B-B of FIG. 1(*a*), while FIG. 2 is a longitudinal cross-sectional view of a surface-mounted oscillator. Parts the same as in the conventional technique are denoted by the same reference symbols and description thereof is simplified or omitted.

In the surface-mounted oscillator 1 of the first embodiment of the present invention, as shown in FIG. 2, a crystal piece 3C is accommodated in a container main body 2 having a concavity 2*e*, and a cover 4 is connected to an open end face of the container main body 2. The container main body 2 is made from ceramics, and is formed with a frame wall 2*b* laminated on a planar bottom wall 2*a*. On an inner bottom face 2*c* of the container main body 2 there is provided a crystal retention terminal 5. The crystal retention terminal 5 is electrically connected to a mount terminal 7 formed on an outer bottom face 2*d* of the container main body 2, via a conduction path 6.

The crystal piece 3C accommodated in the container main body 2 is rectangular in plan view. Furthermore, the crystal piece 3C is AT cut, with the longitudinal direction thereof as the X axis, the widthwise direction as the Z' axis, and the thickness direction as the Y' axis. Moreover, an excitation electrode 8 is formed on both main surfaces of the crystal piece 3C, and on both sides of one end portion in the longitudinal direction thereof, on both main faces of the crystal piece 3C, there is formed support electrodes 10*a* to 10*d* which are electrically connected to the excitation electrodes 8 using a connection electrode 9. The support electrodes 10*a* to 10*d* extend to the edge of one end portion of a crystal piece 3C.

Consequently, the support electrodes 10*a* to 10*d* extend to the outer peripheral edge of the crystal piece 3C.

Furthermore, on one main face of the crystal piece 3C, a jetty 11 is formed integral with the crystal piece 3C. The jetty 11 is between the support electrodes 10*a* and 10*b* and the excitation electrode 8, and comprises a first jetty component 12*a* that is formed along the full width in the widthwise direction of the crystal piece 3C, and a second jetty component 12*b* that extends from the centre of the first jetty component 12*a*, passing between the support electrode 10*a* and the support electrode 10*b*, to the periphery of one end portion of the crystal piece 3C. As a result, the jetty 11 that protrudes on the periphery of the support electrode 10*a* and the support electrode 10*b* is formed. Since the jetty 11 and the crystal piece 3C are formed integrally, the connection electrode 9, as shown by the imaginary line in FIG. 1(*b*), is formed in the area that passes through the surface of the jetty 11.

Furthermore, in the crystal piece 3C, the support electrodes 10*a* and 10*b* are bonded to the crystal retention terminal 5 with the electroconductive adhesive 13, and fixed to the inner bottom face 2*c* of the container main body 2.

With such a configuration, at first, a metallised layer of W, or Mo, or the like is deposited by printing to the ceramic green sheet (not shown in the figure) for the bottom wall that becomes the bottom wall 2*a*, to form the ground of the mount terminal 7, the crystal retention terminal 5, and the conduction path 6. The ground of the conduction path 6*a* which is a part of the conduction path 6, and connects the one main face of the bottom wall 2*a* and the other main face, is formed on the side face of a through hole (not shown in the figure) that is previously formed in the ceramic green sheet for the bottom wall. Furthermore, a through hole (not shown in the figure) that becomes the concavity of the container main body 2, is formed in the ceramic green sheet (not shown in the figure) for the wall that becomes the frame wall 2*b*.

Next, the ceramic green sheet for the bottom wall and the ceramic green sheet for the frame wall are laminated and baked. Then, a metallic film with the bottom layer a Ni film and the top layer an Au film, is formed by electrolytic plating or electroless plating. As a result, the mount terminal 7, the crystal retention terminal 5, and the conduction path 6 are formed. Next, the laminated ceramic green sheet is divided up to form the container main body 2 in individual pieces.

Figure 3:
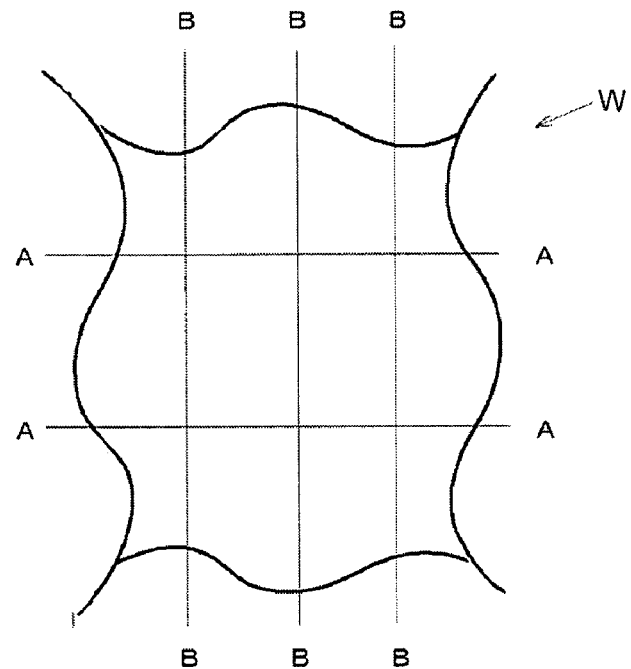
FIG. 3 is a plan view of a crystal wafer that constitutes the surface-mounted oscillator of the first embodiment of the present invention.
Figure 3:
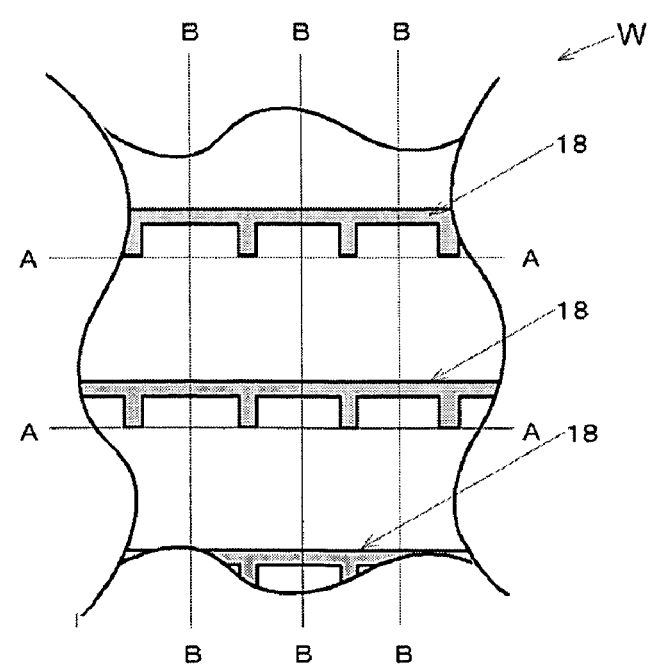

Next is a description of the method of manufacturing the crystal piece 3C referring to FIG. 3. At first, a flat crystal wafer W is prepared (refer to FIG. 3(*a*)). Next, using a known photolithography technique, a mask 18 is formed on an area that becomes the jetty of one main face of the crystal wafer W (refer to FIG. 3(*b*)). On the other main face of the crystal wafer W, the jetty is not formed, and hence the mask is formed over the whole face (not shown in the figure).

Next, the area where the mask 18 is not formed, is subjected to half etching (wet etching) using an etchant of a hydrofluoric acid solution or the like. As a result, the area where the mask 18 is formed becomes the jetty 11. Next, the mask 18 is removed, and then the excitation electrode 8, the connection electrode 9, and the support electrodes 10*a* to 10*d* are formed by spluttering or vapour deposition. Finally, the crystal wafer is diced along the dividing lines A-A and B-B shown in FIG. 3. As a result, the individual pieces of the crystal piece 3C are formed. Half etching may be performed by dry etching.

Next, the electroconductive adhesive 13 is spread on the crystal retention terminal 5 of the container main body 2. Then, the main face of the crystal piece 3C on which the jetty 11 is formed, is faced towards the container main body 2, and the crystal piece 3C is lowered onto the inner bottom face 2*c* of the container main body 2. Then, the support electrodes 10a and 10b are adhered to the electroconductive adhesive 13 that has been spread on the crystal retention terminal 5. Next, the electroconductive adhesive 13 is cured to fix the crystal piece 3C to the inner bottom face 2c of the container main body 2. Finally, the cover 4 is placed on the open end face of the container main body 2, and the cover 4 is connected to the container main body 2 by for example seam welding.

Accordingly to such a configuration, since the jetty 11 which becomes the wall is formed on the periphery of the support electrodes 10a and 10b, the electroconductive adhesive 13 that is adhered to the support electrodes 10a and 10b does not flow out towards the excitation electrode 8. Consequently, the likelihood of an increase in the CI value of the crystal piece 3C due to flowing out of the electroconductive adhesive 13 is reduced. Furthermore, since the jetty 11 which constitutes the wall, is formed integrally with the crystal piece 3C, it is unlikely to peel away from the crystal piece 3C. Consequently, there is no longer the situation where the contact area between the crystal piece 3C and the jetty 11 changes so that the oscillation frequency or the vibration characteristics of the CI value or the like change, and hence the vibration characteristics are stable and favourably maintained. Furthermore, since the jetty 11 is made from crystal, there is no longer the situation for example as with the conventional example, where siloxane gas is released from the jetty 11 over time. Consequently, the likelihood of a change in the frequency of the crystal piece 3C due to the mass addition effect is reduced.

Furthermore, since the jetty 11 is formed by etching, it can be formed with a dimensional accuracy of the order of a micron. Moreover, the jetty 11 becomes the wall, so that the electroconductive adhesive 13 does not flow out to the outside of the jetty 11. Hence in the surface-mounted element 1 of the first embodiment, the contact area of the electroconductive adhesive 13 in the crystal piece 3C becomes uniform with high accuracy. Consequently, there is no longer the situation where the frequency characteristics differ for each component, so that quality in regards to the frequency characteristics becomes uniform.

(Modified Example Of First Embodiment)

Figure 4:
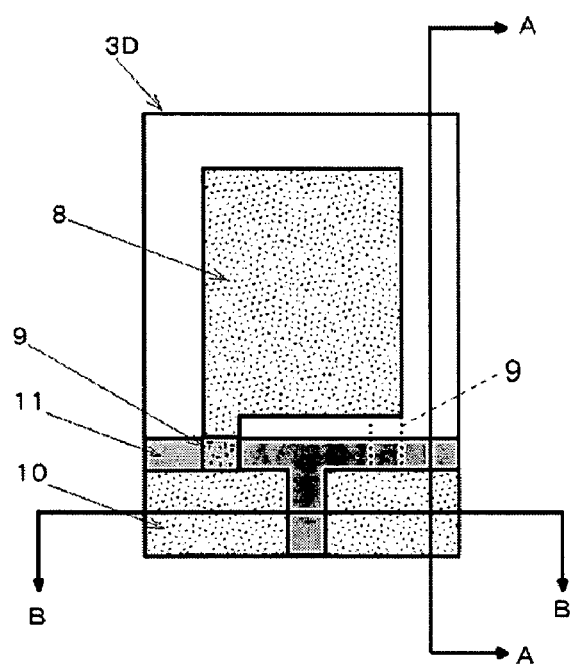
FIG. 4 is a diagram for explaining a modified example of the first embodiment of the present invention, wherein (a) is a plan view of a crystal piece, (b) is a cross-sectional view on arrows A-A of (a), and (c) is a cross-sectional view on arrows B-B of (a).
Figure 4:
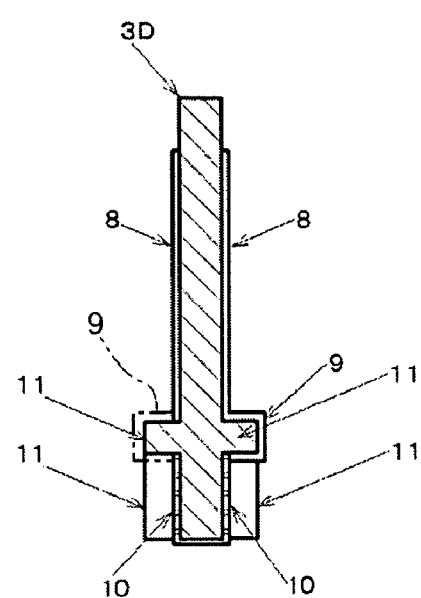
Figure 4:
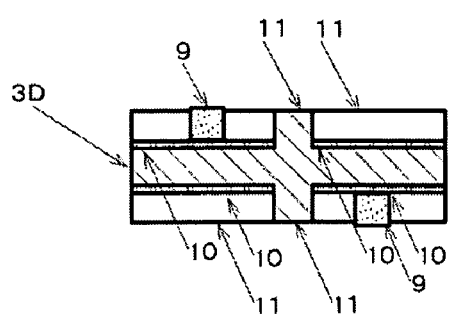
Figure 5:
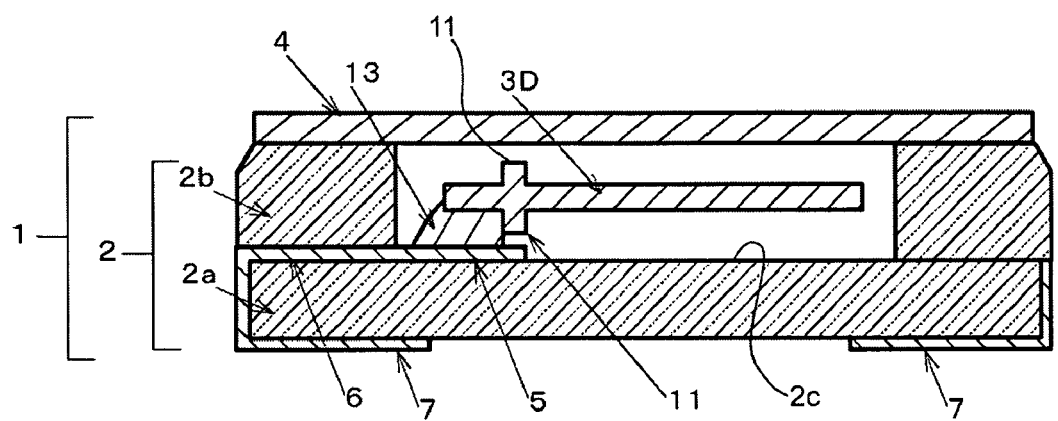
FIG. 5 is a longitudinal cross-sectional view for explaining a modified example of a first embodiment of a surface-mounted oscillator of the present invention.

FIG. 4 and FIG. 5 are diagrams for explaining a modified example of the first embodiment of the present invention, wherein FIG. 4(a) is a plan view of a crystal piece, FIG. 4(b) is a cross-sectional view on arrows A-A of FIG. 4(a), and FIG. 4(c) is a cross-sectional view on arrows B-B of FIG. 4(a), while FIG. 5 is a longitudinal cross-sectional view of a surface-mounted oscillator of the modified example. Parts the same as in the above embodiment are denoted by the same reference symbols and description thereof is simplified or omitted.

The point of difference between the present modified exampled, and the aforementioned first embodiment, is the position of forming the jetty 11. That is to say, as shown in FIG. 5, in the present embodiment, the jetty 11 is formed on both main faces of a crystal piece 3D. The jetty 11 can be formed by forming the mask 18 shown in FIG. 3(b) on both main faces of the crystal wafer W, and then half etching. Furthermore, the crystal piece 3D, as shown in FIG. 5, is fixed to the inner bottom face 2c of the container main body 2 by the electroconductive adhesive 13.

According to such a configuration, when the crystal piece 3D is fixed to the inner bottom face 2c of the container main body 2, then even if the main face of either one of the first main face or the second main face of the crystal piece 3D is made to face the inner bottom face 2c of the container main body 2, the flowing out of the electroconductive adhesive 13 can be prevented by the jetty 11. Consequently, when the crystal piece 3D is fixed to the inner bottom face 2c of the container main body 2, the process for distinguishing between the main face and the other main face of the crystal piece 3 is unnecessary, and hence the manufacturing process can be simplified.

(Second Modified Example)

Figure 6:
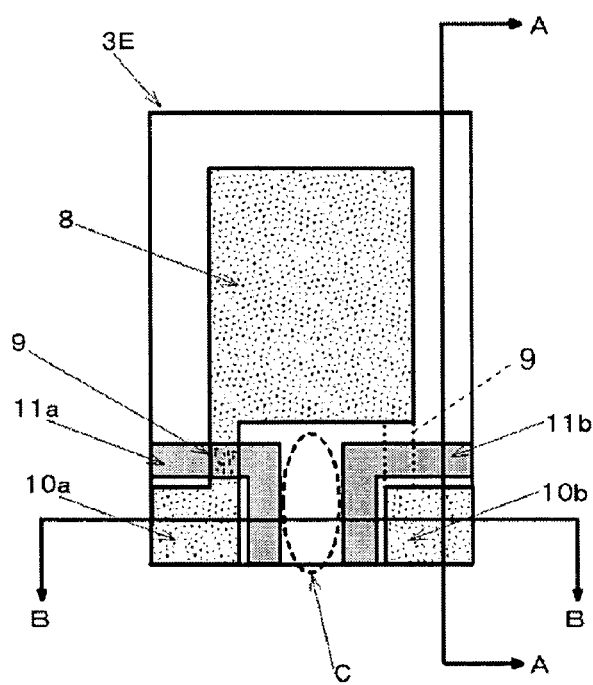
FIG. 6 is a diagram for explaining a second embodiment of the present invention, wherein (a) is a plan view of a crystal piece, (b) is a cross-sectional view on arrows A-A of (a), and (c) is a cross-sectional view on arrows B-B of (a).
Figure 6:
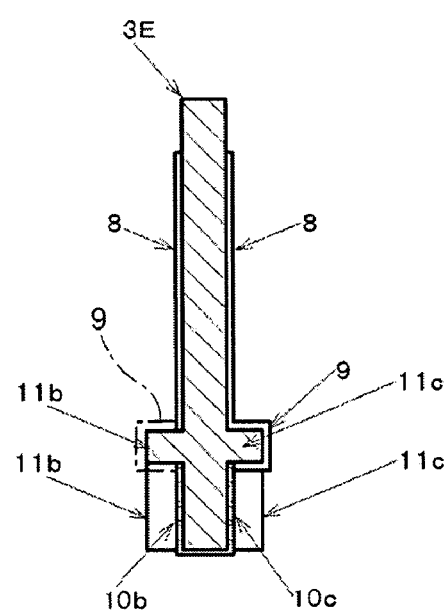
Figure 6:
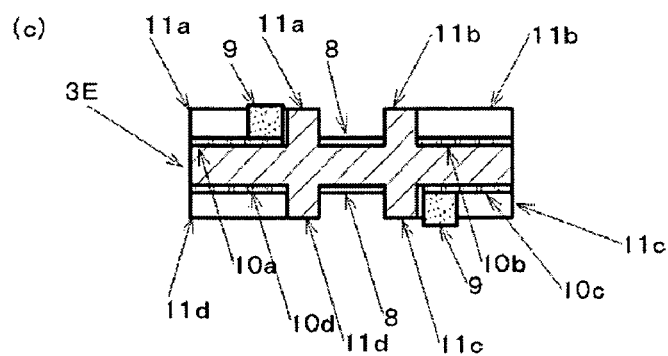
Figure 7:
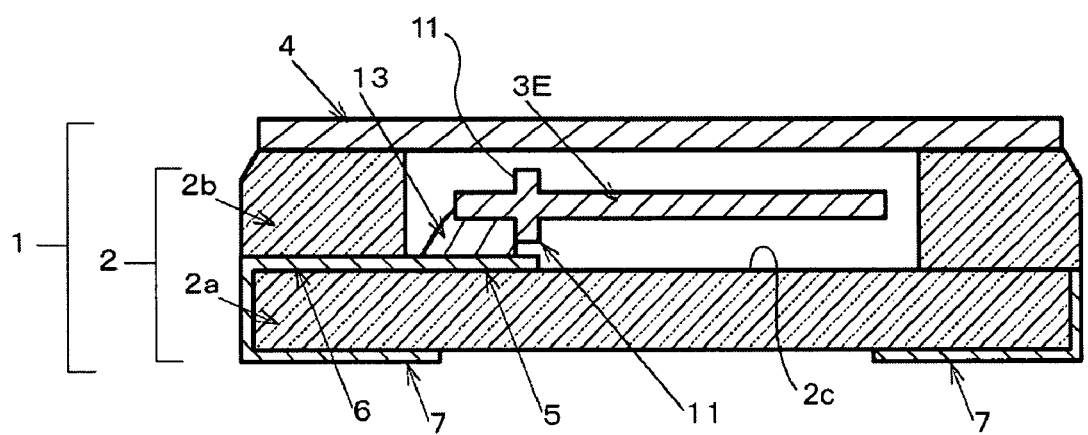
FIG. 7 is a longitudinal cross-sectional view for explaining a second embodiment of a surface-mounted oscillator of the present invention.

FIG. 6 and FIG. 7 are diagrams for explaining a second embodiment of the present invention, wherein FIG. 6(a) is a plan view of a crystal piece, FIG. 6(b) is a cross-sectional view on arrows A-A of (a), and FIG. 6(c) is a cross-sectional view on arrows B-B of (a), while FIG. 7 is a longitudinal cross-sectional view of the second embodiment of a surface-mounted oscillator of the present invention. Parts the same as in the aforementioned embodiment are denoted by the same reference symbols and description thereof is simplified or omitted.

The point of difference between the second modified example and the aforementioned first embodiment, is the shape of the jetty 11 that is formed on a crystal piece 3E. That is to say, regarding the crystal piece 3E of the second embodiment, on one main face, a first jetty 11a is formed on the periphery of the support electrode 10a, and a second jetty 11b is formed on the periphery of the support electrode 10b. Furthermore, the first jetty 11a and the second jetty 11b are spaced apart by the central area C (refer to FIG. 6(a)) of the support electrodes 10a and 10b. The thickness of the crystal piece 3E in the central area C, and the thickness of the crystal piece 3E in the area in which the excitation electrode 8 is formed are the same.

Furthermore, also on the other main face of the crystal piece 3E, similarly, a first jetty 11c is formed on the periphery of the support electrode 10c, and a second jetty 11d is formed on the periphery of the support electrode 10d, and the jetty 11c and the jetty 11d are spaced apart. Regarding such jettys 11a to 11d, these can be formed by making the mask formed on the crystal wafer the shape of the first jettys 11a and 11c, and the second jettys 11c and 11d, and then half etching. Furthermore, regarding the crystal piece 3E, as shown in FIG. 7, this is fixed to the inner bottom face 2c of the container main body 2 by means of the electroconductive adhesive 13.

According to such a configuration, the first jettys 11a and 11c and the second jettys 11b and 11d are spaced apart particularly by the central area C, and are made the same thickness as the central area on which the excitation electrode 8 is formed. Consequently, the vibration area of the thickness-shear vibration that changes in the X axis direction is widened, and hence the vibration characteristics, in particular of the crystal piece including the CI value become favorable. In the case where between the first jettys 11a and 11c and the second jettys 11b and 11d are not spaced apart, and are continuous in the Z' direction (widthwise direction), the thickness of the jetty part is greater than the thickness of the excitation electrode part, so that the vibration energy at the excitation electrode part is absorbed by the jetty part, leading to a reduction or the like in the CI value of the crystal piece 3E. In short, this can be handled more as a configuration approaching an infinite plane, than for the case of the first embodiment. Therefore the design of the crystal piece 3E can be simplified.

(Third Embodiment)

Figure 8:
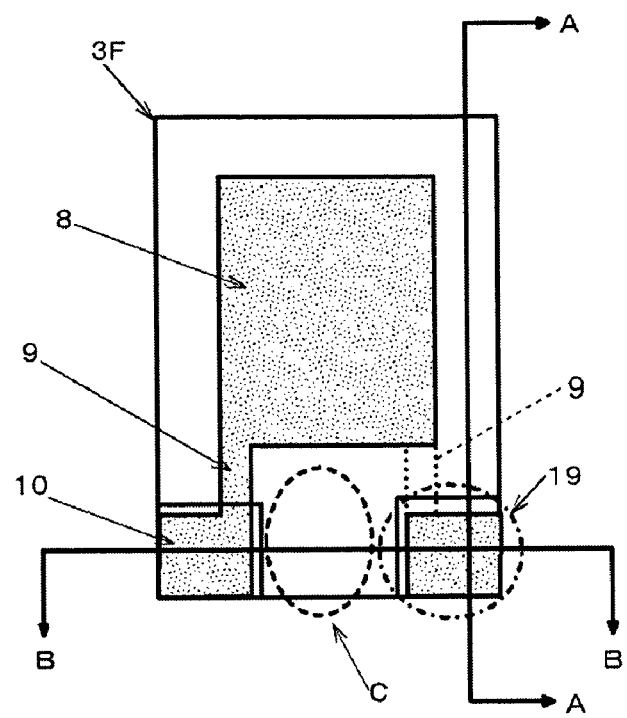
FIG. 8 is a diagram for explaining a third embodiment of a surface-mounted oscillator of the present invention, wherein (a) is a plan view of a crystal piece, (b) is a cross-sectional view on arrows A-A of (a), and (c) is a cross-sectional view on arrows B-B of (a).
Figure 8:
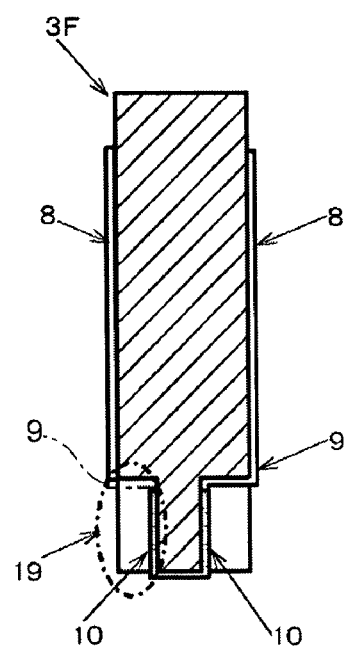
Figure 8:
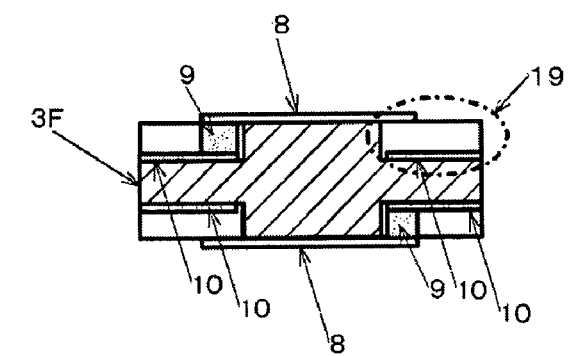
Figure 9:
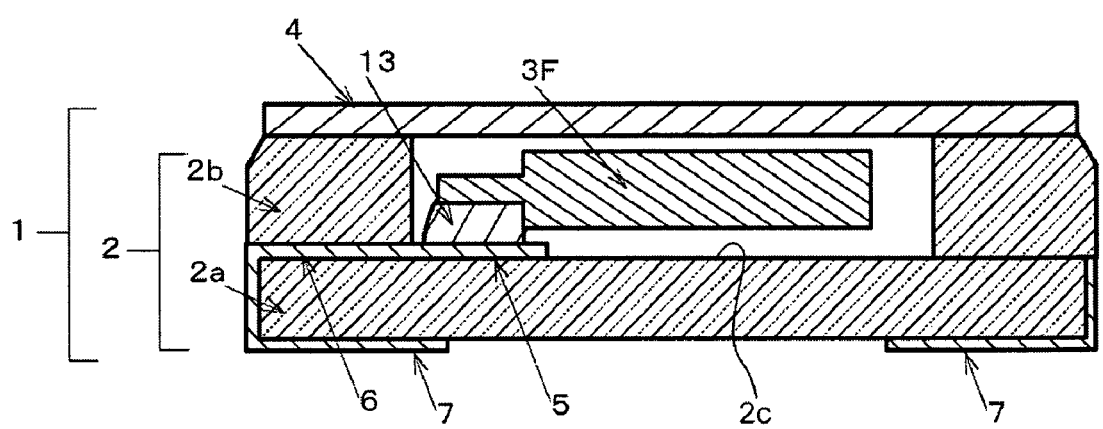
FIG. 9 is a longitudinal cross-sectional view for explaining the third embodiment of a surface-mounted oscillator of the present invention.

FIG. 8 is a diagram for explaining a third embodiment of the present invention, wherein FIG. 8(a) is a plan view of a crystal piece, FIG. 8(b) is a cross-sectional view on arrows A-A of (a), and FIG. 8(c) is a cross-sectional view on arrows B-B of (a), while FIG. 9 is a longitudinal cross-sectional view of a surface-mounted oscillator of the present embodiment.

Parts the same as in the aforementioned embodiment are denoted by the same reference symbols and description thereof is simplified or omitted.

In this embodiment, a depression 19 is formed on both sides of one end portion in the both main faces of a flat crystal piece 3F. Because the outside face of the crystal piece 3F is open, the depression 19 extends as far as the outside face of the crystal piece 3F. On the bottom face of the depression 19 there is formed a support electrode 10. Such a depression 19 can be formed by forming a mask formed on the crystal wafer on an area excluding the area that becomes the depression 19, and then half etching. Furthermore, the crystal piece 3F, as shown in FIG. 9 is fixed to the inner bottom face 2c of the container main body 2 by the electro conductive adhesive 13. The thickness of the crystal piece 3F in the central area C of the support electrode 10, and the thickness of the crystal piece 3F in the area in which the excitation electrode 8 is formed, are the same.

According to such a configuration, the area in which the excitation electrode 8 of the crystal piece 3F is formed becomes thick, and the area in which the support electrode 10 is formed becomes thin. Consequently, the vibration that is excited by the excitation electrode 8 no longer leaks to the formation area of the support electrode 10, so that deterioration of the CI value of the crystal piece 3F can be avoided. In this case also, similarly to the second embodiment, the central area C between the depressions 19 has the same thickness as the central area in which the excitation electrode 8 is formed. Therefore the design of the crystal piece 3F can be simplified, as a configuration approaching an infinite plane.

(Fourth Embodiment)

Figure 10:
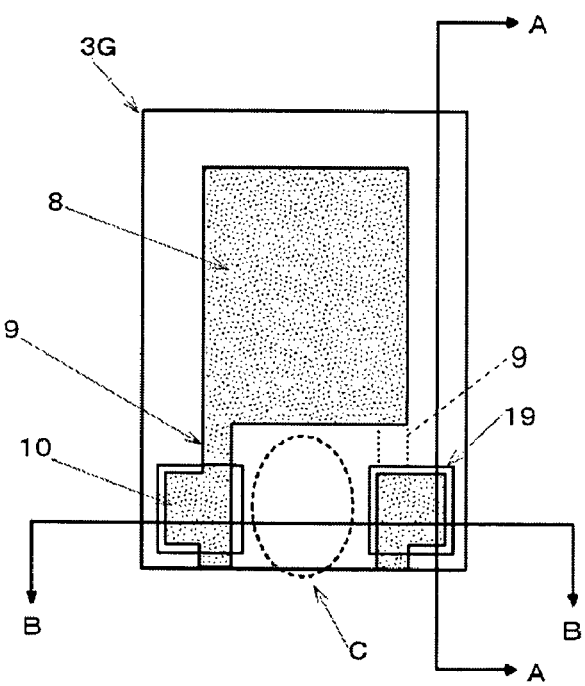
FIG. 10 is a diagram for explaining a fourth embodiment of a surface-mounted oscillator of the present invention, wherein (a) is a plan view of a crystal piece, (b) is a cross-sectional view on arrows A-A of (a), and (c) is a cross-sectional view on arrows B-B of (a).
Figure 10:
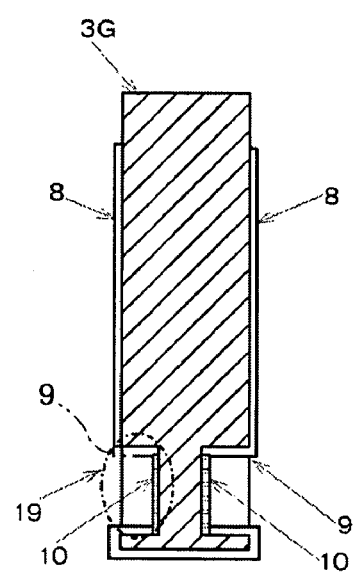
Figure 10:
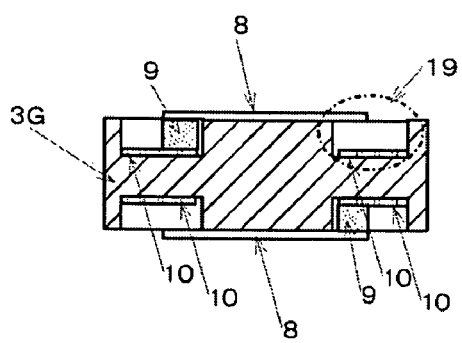
Figure 11:
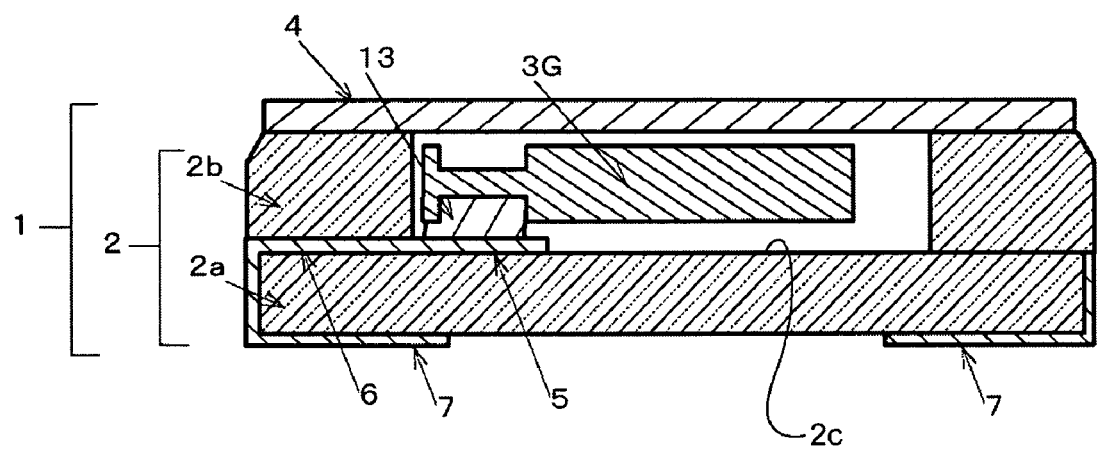
FIG. 11 is a longitudinal cross-sectional view for explaining the fourth embodiment of a surface-mounted oscillator of the present invention.

FIG. 10 and FIG. 11 are diagrams for explaining a fourth embodiment of the present invention, wherein FIG. 10(a) is a plan view of a crystal piece, FIG. 10(b) is a cross-sectional view on arrows A-A of FIG. 10(a), and FIG. 10(c) is a cross-sectional view on arrows B-B of FIG. 10(a), while FIG. 11 is a longitudinal cross-sectional view of a surface-mounted oscillator of the present invention. Parts the same as in the above embodiment are denoted by the same reference symbols and description thereof is simplified or omitted.

In this embodiment, a depression 19 is formed in both sides of one end portion in both main faces of a flat crystal piece 3G. Regarding the depression 19, the side face is closed, and the outside face of the crystal piece 3G is not open. Such a depression 19 can be formed by forming a mask formed on the crystal wafer on an area excluding the area that becomes the depression 19, and then half etching. Furthermore, the crystal piece 3G, as shown in FIG. 11, is fixed to the inner bottom face 2c of the container main body 2 by the electroconductive adhesive 13. The thickness of the crystal piece 3G in the central area C of the support electrode 10, and the thickness of the crystal piece 3G in the area in which the excitation electrode 8 is formed, are the same.

According to such a configuration, similarly to the aforementioned third embodiment, the area of the crystal piece 3G in which the excitation electrode 8 is formed becomes thick, and the area in which the support electrode 10 is formed becomes thin. Consequently, the vibration that is excited by the excitation electrode 8 no longer leaks to the formation area of the support electrode 10, so that deterioration of the CI value of the crystal piece 3G can be avoided. In this case also, similarly to above, the central area C between the depressions 19 has the same thickness as the central area in which the excitation electrode 8 is formed. Therefore, the design of the crystal piece 3G can be simplified, as a configuration approaching an infinite plane.

(Fifth Embodiment)

Figure 12:
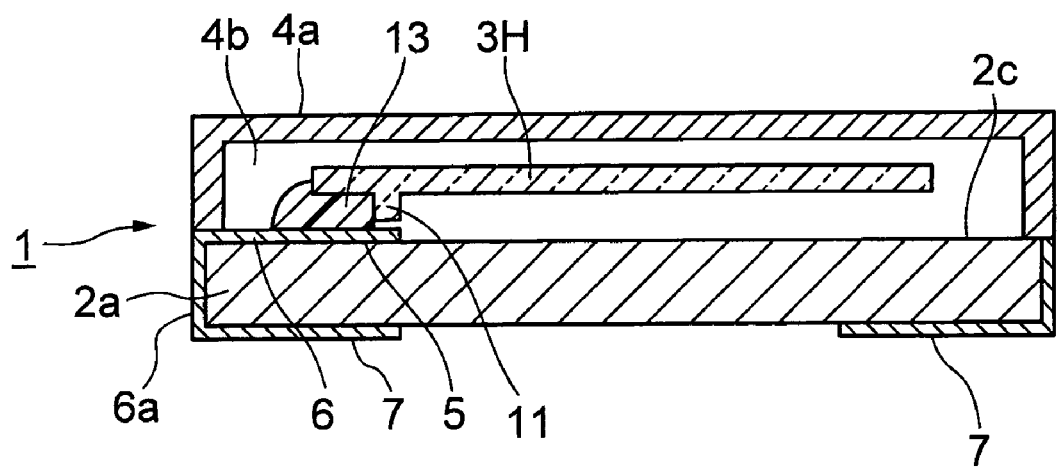
FIG. 12 is a diagram for explaining a fifth embodiment of a surface-mounted oscillator of the present invention
Figure 13:
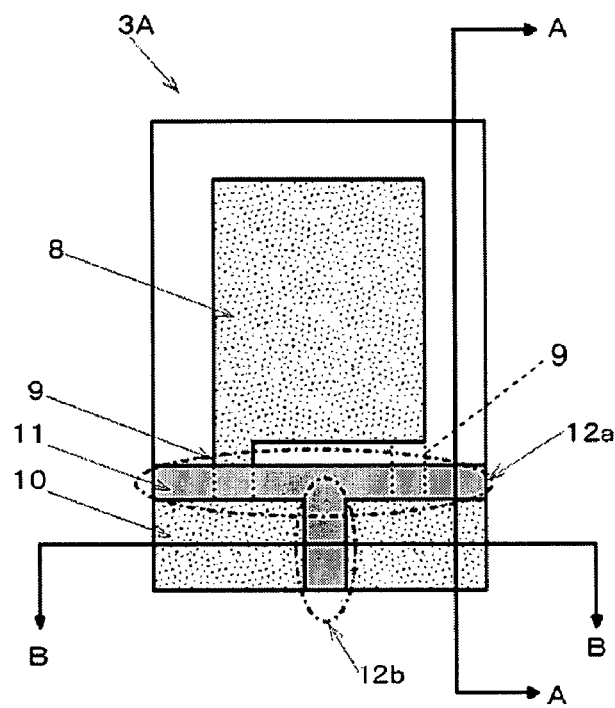
FIG. 13 is a diagram for explaining a first conventional technique, wherein (a) is a plan view of a crystal piece, (b) is a cross-sectional view on arrows A-A of (a), and (c) is a cross-sectional view on arrows B-B of (a).
Figure 13:
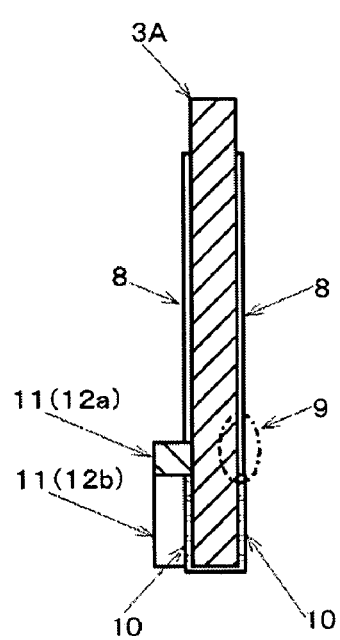
Figure 13:
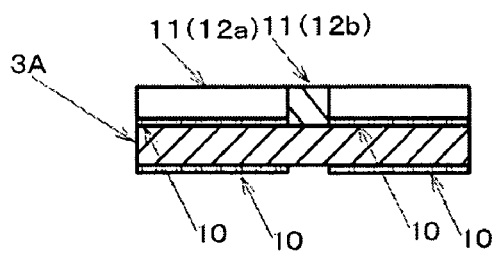
Figure 14:
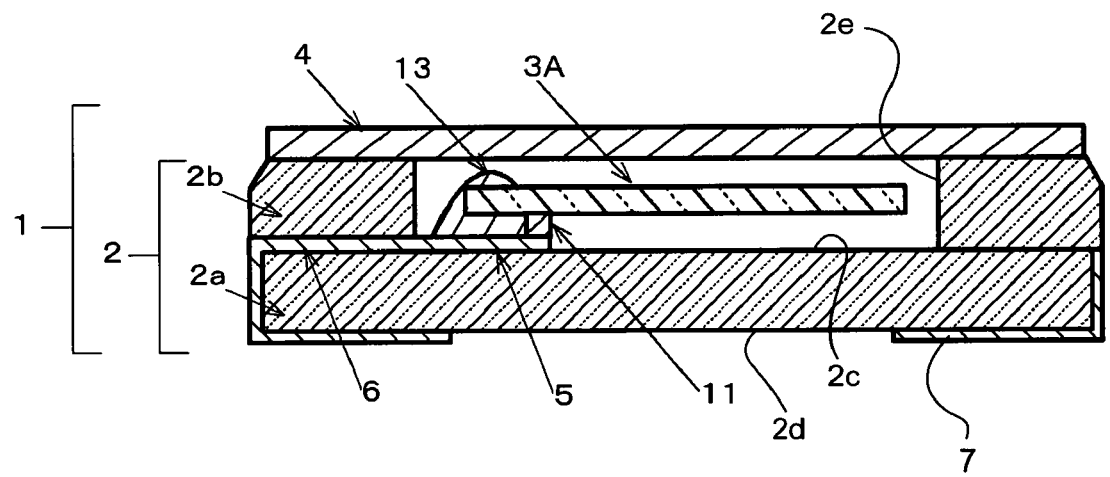
FIG. 14 is a longitudinal cross-sectional view for explaining the first conventional technique of a surface-mounted oscillator.
Figure 15:
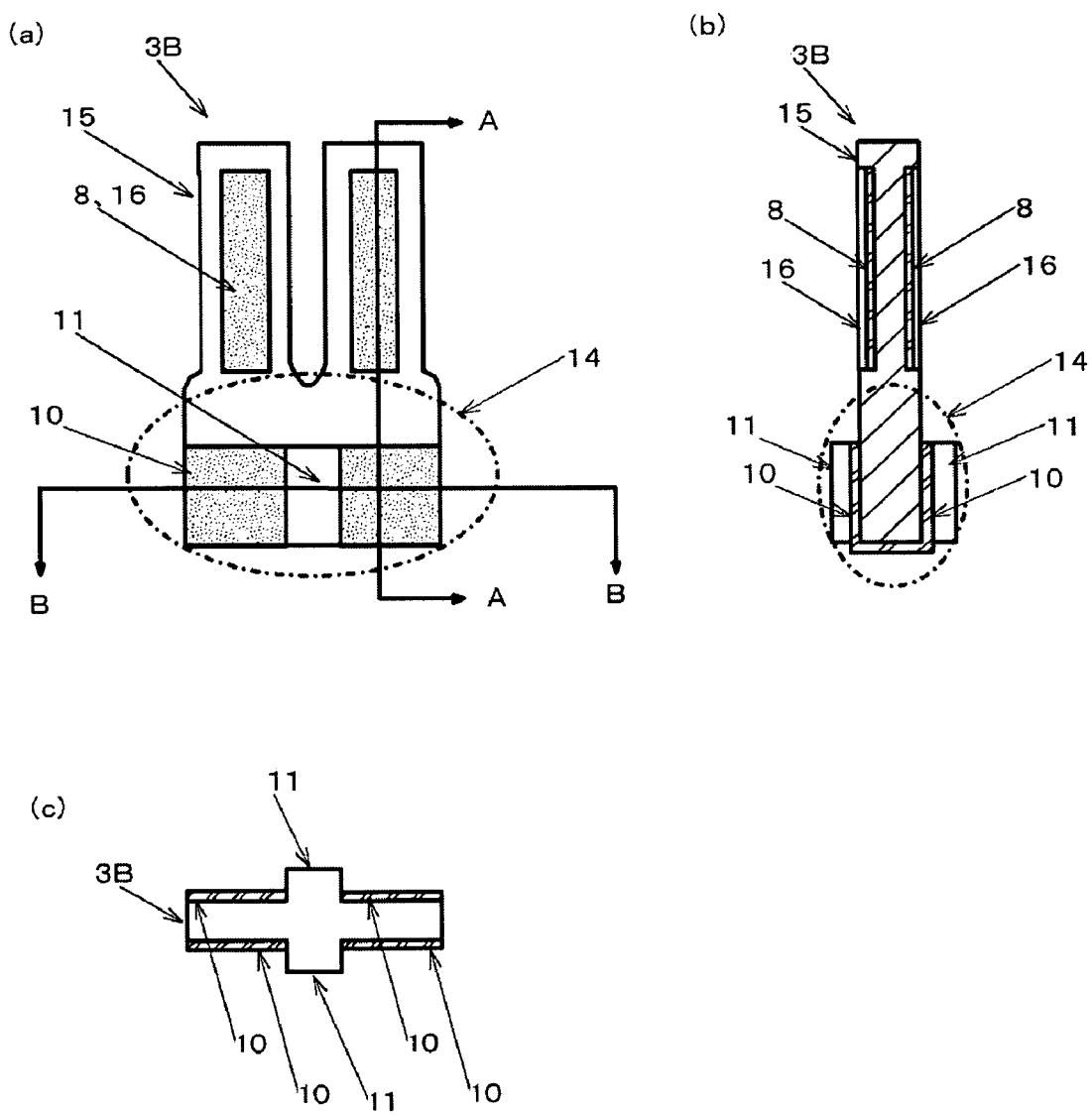
FIG. 15 is a diagram for explaining a second conventional technique of a surface-mounted oscillator, wherein (a) is a plan view of a crystal piece, (b) is a cross-sectional view on arrows A-A of (a), and (c) is a cross-sectional view on arrows B-B of (a).

In the surface-mounted oscillator 1 of a fifth embodiment of the present invention, as shown in FIG. 12, instead of the cover 4 shown in the aforementioned first embodiment, a lid 4a having a concavity 4b of a concave cross-section shape, is covered to seal the crystal piece 3.

That is to say, in the fifth embodiment, as shown in FIG. 12, a crystal piece 3H is mounted on the upper face 2c of the planar base 2a made from a glass or crystal, by means of an electroconductive adhesive 13 via a crystal retention terminal 5, and the lid 4a made from glass or crystal and having the concavity 4b is covered over the base 2a, to thereby seal the crystal piece 3H inside the concavity 4b. Furthermore, a peripheral edge portion of the base 2a and the lid 4a is connected by anodic bonding or various bonding materials.

Next is a description of a method of manufacturing the surface-mounted oscillator of the fifth embodiment. At first the electrodes and the like are formed on a base wafer. Next, a concavity is formed in a lead wafer by etching. Furthermore, unitized crystal pieces 3H are mounted on the base wafer. After this, the lead wafer is connected to the base wafer by the aforementioned method, and then the connected wafer is cut by dicing, to form the individual pieces of the crystal oscillator 1.

Furthermore, as a modified example of the fifth embodiment, instead of forming the concavity 4b that seals and accommodates the crystal piece 3H, in the lid 4a, this may be formed in the upper face of the base 2a.

[Industrial Applicability]

In the above embodiments, a surface-mounted oscillator has been described, however the present invention is also applicable to a crystal oscillator in which the mount terminal is a lead wire. Furthermore, the present invention is also applicable to a crystal oscillator on which is mounted an IC formed with an oscillation circuit. Moreover, this may be applied to a tuning fork type crystal piece. Furthermore, this may be applied to a crystal piece that has been bevel processed or convex processed.

What is claimed is:

1. A crystal device comprising:
    a container main body having a concavity, with a crystal retention terminal formed in a bottom face of said concavity, and with a mounting terminal that is electrically connected to said crystal retention terminal formed on an outer bottom face;
    a crystal piece accommodated in said concavity, with an excitation electrode formed on both main faces, and with a support electrode that is electrically connected to said excitation electrode using a connecting electrode, formed on both sides of one end portion, and with said support electrode bonded to said crystal retention terminal with an electroconductive adhesive; and
    a cover that is connected to an open end face of said container main body and hermetically seals said crystal piece,
    wherein the crystal piece further includes a jetty defining a main face of said crystal piece, said jetty protrudes on a periphery of said support electrode, and said jetty is formed integral with said crystal piece, and
    wherein at least a portion of the connecting electrode is formed in an area that passes through a surface of said jetty.

2. A crystal device according to claim 1, wherein said jetty is formed on a periphery of said support electrode, so that a side face on said support electrode side of said jetty becomes a wall.

3. A crystal device according to claim 2, wherein a first jetty that surrounds the periphery of said support electrode formed on one side of said one end portion of said crystal piece, and a second jetty that surrounds the periphery of said support electrode formed on the other side, are formed spaced apart.

4. A crystal device according to claim 1, wherein a depression is formed in both sides of one end portion of said crystal piece, and said depression is open to an outside face of said crystal piece, and said support electrode is formed in a bottom face of said depression, and a side face of said depression becomes said jetty.

5. A crystal device according to claim 1, wherein a depression with a closed side face is formed in both sides of one end portion of said crystal piece, and said support electrode is formed in a bottom face of said depression, and a side face of said depression becomes said jetty.

6. A crystal device according to claim 3, wherein said crystal piece is rectangular in plan view, and a thickness of said crystal piece in a central area of said support electrode formed on both sides of said crystal piece, and in an area in which said excitation electrode is formed is the same.

7. A crystal device comprising:
a base with a crystal retention terminal formed on an upper face, and with a mounting terminal that is electrically connected to said crystal retention terminal formed on an outer bottom face;
a crystal piece mounted on said base, with an excitation electrode formed on both main faces, and with a support electrode that is electrically connected to said excitation electrode using a connecting electrode, formed on both sides of one end portion, and with said support electrode bonded to said crystal retention terminal with an electroconductive adhesive; and
a lid having a concavity, that is connected to an outer rim end face of said base, and hermetically seals said crystal piece,
wherein there is provided a jetty defining a main face of said crystal piece, and that protrudes on a periphery of said support electrode, and said jetty is formed integral with said crystal piece, and
wherein at least a portion of the connecting electrode is formed in an area that passes through a surface of said jetty.

8. A crystal device comprising:
a base having a concavity in an upper face, with a crystal retention terminal formed in a bottom face of said concavity, and with a mounting terminal that is electrically connected to said crystal retention terminal formed on an outer bottom face;
a crystal piece accommodated in said concavity, with an excitation electrode formed on both main faces, and with a support electrode that is electrically connected to said excitation electrode using a connecting electrode, formed on both sides of one end portion, and with said support electrode bonded to said crystal retention terminal with an electroconductive adhesive; and
a cover that is connected to an outer rim end face of said base, and hermetically seals said crystal piece,
wherein there is provided a jetty defining a main face of said crystal piece, and that protrudes on a periphery of said support electrode, and said jetty is formed integral with said crystal piece, and
wherein at least a portion of the connecting electrode is formed in an area that passes through a surface of said jetty.

9. A crystal piece with an excitation electrode formed on both main faces, and with a support electrode that is electrically connected to said excitation electrode using a connecting electrode, formed on both sides of one end portion,
wherein there is provided a jetty defining a main face of said crystal piece, and that protrudes on a periphery of said support electrode, and said jetty is formed integral with said crystal piece, and
wherein at least a portion of the connecting electrode is formed in an area that passes through a surface of said jetty.

10. A crystal piece according to claim 9, wherein a wall is formed on a periphery of said support electrode, so that a side face on said support electrode side of said wall becomes said jetty.

11. A crystal piece according to claim 10, wherein a first jetty that surrounds the periphery of said support electrode formed on one side of said one end portion of said crystal piece, and a second jetty that surrounds the periphery of said support electrode formed on the other side, are formed spaced apart.

12. A crystal piece according to claim 9, wherein a depression is formed in both sides of one end portion of said crystal piece, and said depression is open to an outside face of said crystal piece, and said support electrode is formed in a bottom face of said depression, and a side face of said depression becomes said jetty.

13. A crystal piece according to claim 9, wherein a depression with a closed side face is formed in both sides of one end portion of said crystal piece, and said support electrode is formed in a bottom face of said depression, and a side face of said depression becomes said jetty.

14. A crystal piece according to claim 11, wherein said crystal piece is rectangular in plan view, and a thickness of said crystal piece in a central area of said support electrode formed on both sides of said crystal piece, and in an area in which said excitation electrode is formed is the same.

* * * * *